United States Patent
Apalkov et al.

(10) Patent No.: US 11,776,726 B2
(45) Date of Patent: Oct. 3, 2023

(54) DIPOLE-COUPLED SPIN-ORBIT TORQUE STRUCTURE

(71) Applicant: Samsung Electronics Co., Ltd., Gyeonggi-do (KR)

(72) Inventors: Dmytro Apalkov, San Jose, CA (US); Jaewoo Jeong, San Jose, CA (US); Ikhtiar, San Jose, CA (US); Roman Chepulskyy, Santa Clara, CA (US)

(73) Assignee: Samsung Electronics Co., Ltd., Yongin-si (KR)

( * ) Notice: Subject to any disclaimer, the term of this patent is extended or adjusted under 35 U.S.C. 154(b) by 336 days.

(21) Appl. No.: 17/127,695

(22) Filed: Dec. 18, 2020

(65) Prior Publication Data

US 2022/0068538 A1    Mar. 3, 2022

Related U.S. Application Data (60) Provisional application No. 63/072,805, filed on Aug. 31, 2020.

(51) Int. Cl.
| | |
|---|---|
| *H01F 10/32* | (2006.01) |
| *G11C 11/16* | (2006.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC ........ *H01F 10/3286* (2013.01); *G11C 11/161* (2013.01); *G11C 11/1675* (2013.01); *H01F 10/329* (2013.01); *H10N 50/01* (2023.02); *H10N 50/10* (2023.02); *H10N 50/80* (2023.02); *H10N 50/85* (2023.02)

(58) Field of Classification Search
CPC ..................... G11C 11/161; G11C 11/1675
See application file for complete search history.

(56) References Cited

U.S. PATENT DOCUMENTS

| | | | |
|---|---|---|---|
| 8,866,207 B2 | 10/2014 | Hu | |
| 8,889,433 B2 | 11/2014 | De Brosse | |
| 9,502,641 B2 * | 11/2016 | Hu | ............ H01L 43/08 |
| 2016/0163966 A1 * | 6/2016 | Hu | ........ G11C 11/1675 365/158 |
| 2020/0326911 A1 * | 10/2020 | Topaloglu | ............ H01L 43/08 |

FOREIGN PATENT DOCUMENTS

WO        2019125383        6/2019

* cited by examiner

*Primary Examiner* — Pho M Luu
(74) *Attorney, Agent, or Firm* — Lewis Roca Rothgerber Christie LLP (57) ABSTRACT

A magnetic device is described. The magnetic device includes a magnetic junction, a spin-orbit interaction (SO) line and a dipole-coupled layer. The magnetic junction includes a free layer. The SO line is adjacent to the free layer, carries a current in-plane and exerts a SO torque on the free layer due to the current passing through the SO line. The free layer being switchable between stable magnetic states using the SO torque. The SO line is between the free layer and the dipole-coupled layer. The dipole-coupled layer is magnetically coupled to the free layer. At least one of the free layer and the dipole-coupled layer has a damping of greater than 0.02.

20 Claims, 9 Drawing Sheets

FIG. 8 ated to write to magnetic junctions using SO torque. Such a high write current density is undesirable. Configuring the free layer to be written at a lower write current density may reduce the energy barrier, adversely affecting thermal stability. Consequently, such a mechanism is undesirable. In addition, very accurate control of the shape of the magnetic junction may be required for some configurations. Such control may result in the magnetic junction being challenging to fabricate. Consequently, a mechanism for improving SO torque magnetic devices is still desired.

DIPOLE-COUPLED SPIN-ORBIT TORQUE STRUCTURE

CROSS REFERENCE TO OTHER APPLICATIONS

This application claims priority to U.S. Provisional Patent Application No. 63/072,805 entitled DIPOLE COUPLED SPIN-ORBIT TORQUE STRUCTURE filed Aug. 31, 2020, which is incorporated herein by reference for all purposes.

BACKGROUND OF THE INVENTION

Magnetic memories, particularly magnetic random-access memories (MRAMs), have drawn increasing interest due to their potential for high read/write speed, excellent endurance, non-volatility and low power consumption during operation. An MRAM can store information utilizing magnetic materials as an information recording medium. Some magnetic memories write to the magnetic material using a current. One such magnetic memory programs magnetic junctions using spin-orbit interaction (SO) torque.

SO torque-based memories, such as an SO torque magnetic random-access memory (SOT-MRAM), utilize conventional magnetic tunneling junctions (MTJs) in conjunction with a line having a high spin-orbit interaction (hereinafter SO line). The conventional MTJ includes a pinned (or reference) layer, a free layer, and a tunneling barrier layer between the pinned and free layers. The MTJ typically resides on a substrate and may include seed and capping layer(s) as well as an antiferromagnetic (AFM) layer. The reference layer and the free layer are magnetic. The magnetization of the reference layer is fixed, or pinned, in a particular direction. The free layer has a changeable magnetization. The reference layer and free layer may have their magnetizations oriented perpendicular to the plane of the layers (perpendicular-to-plane) or in the plane of the layers (in-plane). The SO line is adjacent to the free layer of the conventional MTJ. The high spin-orbit interaction may be due to a bulk effect of the material itself (spin Hall effect), due to interfacial interactions (Rashba effect), some other effect and/or a combination thereof.

In conventional SO memories, writing is performed by driving a current in-plane (CIP) through the SO line. If the free layer magnetic moment is stable in-plane, then the in-plane SO torque alone can switch the free layer between stable states. Thus, a current driven through the adjacent SO line generates an SO torque that may switch the direction of magnetization of the free layer without additional switching mechanism(s). In contrast, if the free layer has a magnetic moment that is stable perpendicular-to-plane, then an additional torque is used. Since the spin orbit torque is in-plane, in order to reliably switch the magnetic moment using the in-plane current, a symmetry breaking additional torque is required, and can be achieved by either modest external magnetic field, an in-stack magnetic bias, or STT torque through an MgO barrier. The in-plane current develops an SO torque, which can be used to rotate the free layer magnetic moment from vertical to near in-plane direction. Switching to the desired direction is completed using the external magnetic bias or STT current. For example, the external magnetic field, an additional AFM layer, or biasing structure may magnetically bias the free layer to complete switching to the desired state.

Although the conventional magnetic junction may be written using SO torque, there are drawbacks. In some cases, a high write current density (current per unit area) may be required to write to magnetic junctions using SO torque. Such a high write current density is undesirable. Configuring the free layer to be written at a lower write current density may reduce the energy barrier, adversely affecting thermal stability. Consequently, such a mechanism is undesirable. In addition, very accurate control of the shape of the magnetic junction may be required for some configurations. Such control may result in the magnetic junction being challenging to fabricate. Consequently, a mechanism for improving SO torque magnetic devices is still desired.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The embodiments relate to magnetic junctions usable in magnetic devices, such as magnetic memories and/or logic devices, and the devices using such magnetic junctions. The magnetic memories may include magnetic random-access memories (MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The embodiments are mainly described in terms of particular methods and systems provided in particular implementations. However, the methods and systems will operate effectively in other implementations. Phrases such as "an embodiment", "one embodiment", "some embodiments", and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps, sub-steps and/or steps in different orders that are not inconsistent with the exemplary embodiments. Thus, the present invention is not intended to be limited to the embodiments shown but is to be accorded the widest scope consistent with the principles and features described herein.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin orbit interaction phenomenon, magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein, is intended merely to better illuminate the invention and is not a limitation on the scope of the invention unless otherwise specified. Further, unless defined otherwise, all terms defined in generally used dictionaries may not be overly interpreted.

A magnetic device is described. The magnetic device includes a magnetic junction, a spin-orbit interaction (SO) line and a dipole-coupled layer. The magnetic junction includes a free layer. The SO line may be adjacent to the free layer, carries a current in-plane and exerts an SO torque on the free layer due to the current passing through the SO line. The free layer being switchable between stable magnetic states using the SO torque. The SO line may be between the free layer and the dipole-coupled layer. The dipole-coupled layer may be magnetically coupled to the free layer. At least one of the free layer and the dipole-coupled layer has a damping of greater than 0.02.

In some embodiments, the magnetic junction includes a reference layer and a nonmagnetic spacer layer between the reference layer and the free layer. The reference layer may include a first magnetic layer, a second magnetic layer, and a nonmagnetic layer between the first magnetic layer and the second magnetic layer. The first and second magnetic layers may be antiferromagnetically coupled. In some embodiments, the free layer has a free layer perpendicular magnetic anisotropy energy greater than a free layer out-of-plane demagnetization energy. The dipole-coupled layer may have a dipole-coupled layer perpendicular magnetic anisotropy energy greater than a dipole-coupled layer out-of-plane demagnetization energy. Thus, in some embodiments, the free layer and/or dipole-coupled layer may have stable states with magnetic moments perpendicular-to-plane. In some embodiments, the stable states of the magnetic moment(s) of the free layer and/or dipole-coupled layer are in-plane. In some such embodiments, the free layer has an in-plane anisotropy at an angle from a direction of the spin polarization of the current. This angle may be at least five degrees and not more than thirty degrees. The free layer may also have a voltage sensitive perpendicular magnetic anisotropy. The dipole-coupled layer may be configured to provide at least partial flux closure for the free layer during switching between the plurality of stable magnetic states.

In some embodiments, the free layer is separated from the dipole-coupled layer by a distance of not more than eight nanometers. In some embodiments, the distance is at least three nanometers and not more than five nanometers.

In some embodiments, the dipole-coupled layer has a dipole-coupled magnetic anisotropy and the free layer has a free layer magnetic anisotropy. The dipole-coupled magnetic anisotropy may be less than the free layer magnetic anisotropy. The free layer has a free layer thickness that may be at least 0.5 nanometers and not more than five nanometers. The dipole-coupled layer has a dipole-coupled thickness that may be within 1.5 nanometers of the free layer thickness.

In some embodiments, the magnetic device includes an antiferromagnetic layer adjacent to the dipole-coupled layer. In some such embodiments, a ferromagnetic layer is between the antiferromagnetic layer and the dipole-coupled layer. The ferromagnetic layer shares an interface with the antiferromagnetic layer. The magnetic device may also include a coupling layer between the ferromagnetic layer and the dipole-coupled layer.

A magnetic device including a magnetic junction, an SO line and a dipole-coupled layer is described. The magnetic junction may include a free layer having a free layer energy barrier due to a free layer-only configuration. The SO line may be adjacent to the free layer, may carry a current in-plane, and may exert an SO torque on the free layer due to the current passing through the SO line. The free layer may be switchable between a plurality of stable magnetic states using the SO torque. The SO line may be between the free layer and the dipole-coupled layer. The free layer and/or the dipole-coupled layer may have a damping of greater than 0.02. The dipole-coupled layer may be magnetically coupled to the free layer such that a combination of the dipole-coupled layer and the free layer has an effective energy barrier at least 1.5 multiplied by the free layer energy barrier. In some embodiments, the effective energy barrier is at least 1.8 multiplied by the free layer energy barrier. The free layer may be separated from the dipole-coupled layer by a distance of not more than eight nanometers. In some embodiments, the distance is at least three nanometers and not more than five nanometers. The free layer may have a free layer magnetic anisotropy. The dipole-coupled layer has a dipole-coupled layer magnetic anisotropy that is less than the free layer magnetic anisotropy in some embodiments. In some embodiments, such as in some smaller lateral sizes (diameters), dipole-coupled layer may have a magnetic anisotropy that is higher than magnetic anisotropy of the free layer.

A method for providing a magnetic device is described. The method may include providing a magnetic junction including a free layer and providing an SO line that may be adjacent to the free layer. The SO line may carry a current in-plane and may exert an SO torque on the free layer due to the current passing through the SO line. The free layer may be switchable between a plurality of stable magnetic states using the SO torque. The method also includes providing a dipole-coupled layer. The SO line may be between the free layer and the dipole-coupled layer. The dipole-coupled layer may be magnetically coupled to the free layer. At least one of the free layer and the dipole-coupled layer may have a damping of greater than 0.02. In some embodiments, providing the SO line further includes providing an SO line having a thickness of not more than eight nanometers.

Figure 1A:
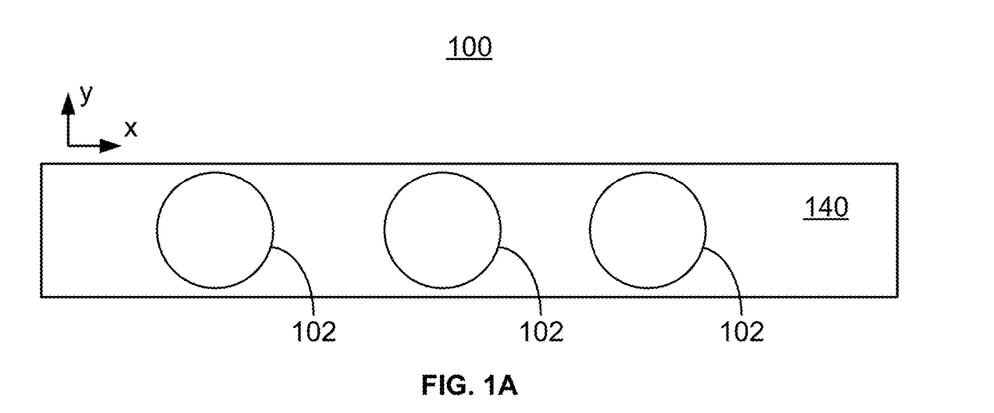
FIGS. 1A-1D depict embodiments of magnetic devices including a magnetic junction written using spin orbit torque and including a dipole-coupled layer.
Figure 1B:
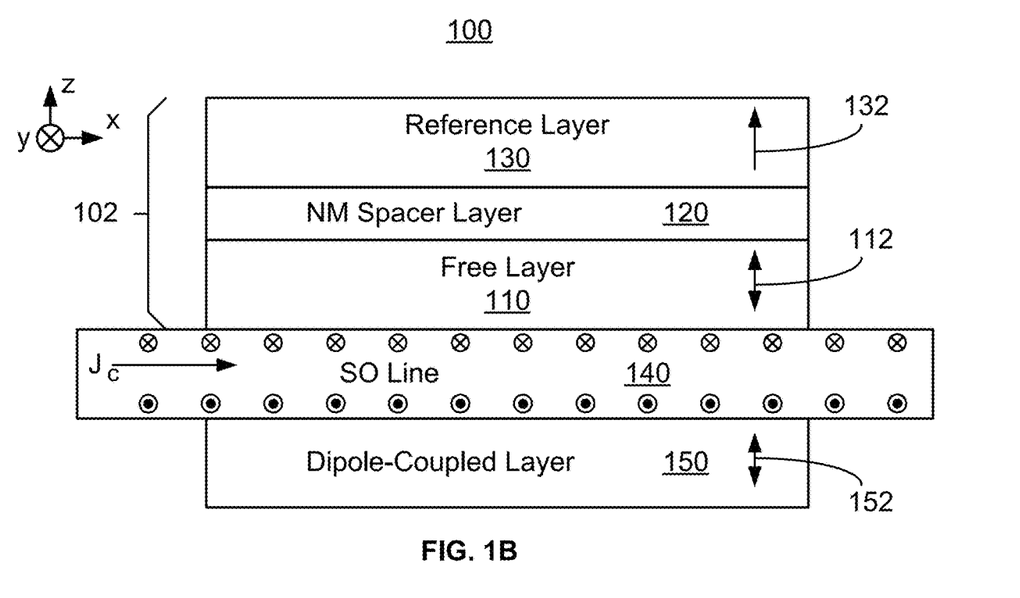
Figure 1C:
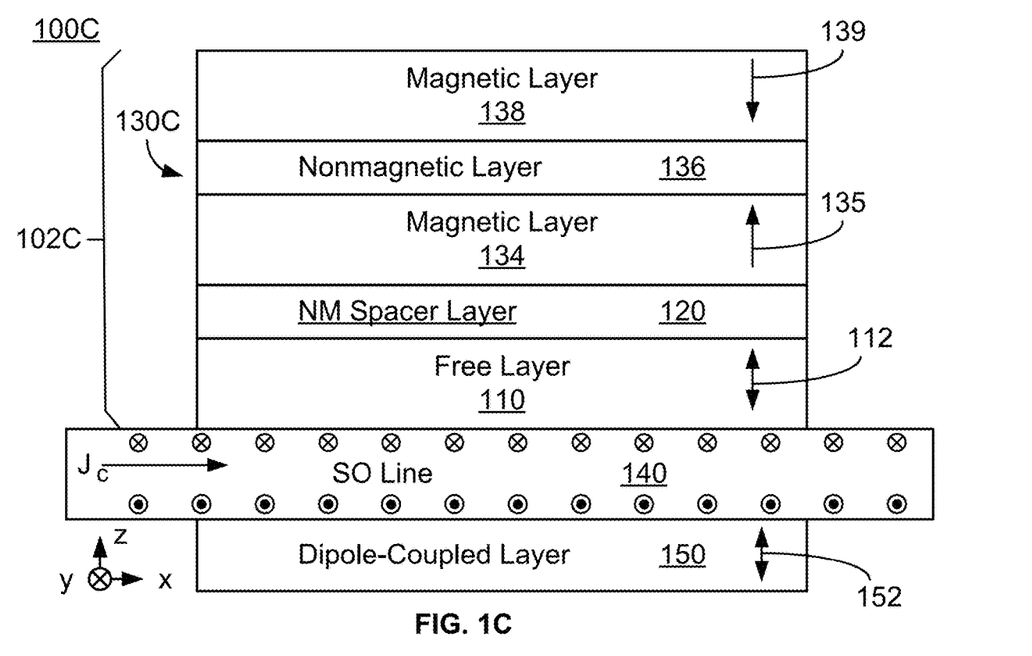
Figure 1D:
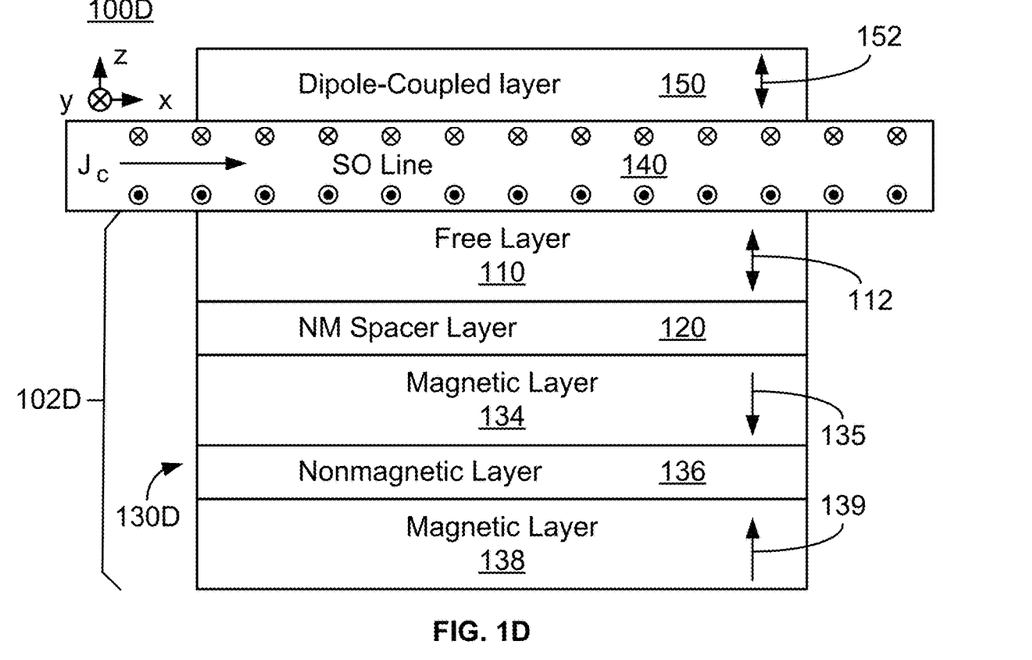

FIGS. 1A-1D depict embodiments of magnetic devices 100, 100C and 100D written using spin orbit torque. FIGS. 1A-1B depict top and side views of an embodiment of a magnetic device including magnetic junctions 102, spin-orbit interaction (SO) line 140 and a dipole-coupled layer 150. FIGS. 1C and 1D depict side views of embodiments of magnetic devices 100C and 100D, respectively, including magnetic junctions 102C and 102D, respectively, written using spin-orbit torque and including dipole-coupled layers 150. Top views for magnetic devices 100C and 100D are analogous to that shown in FIG. 1A. For clarity, FIGS. 1A-1D are not to scale. In addition, portions of the magnetic device 100 such as bit lines, row and column selectors are not shown. In some embodiments, selection devices (not shown) and other components may also be included. Although only one SO line 140 and some (or one) magnetic junctions are shown, multiple magnetic junctions 102, 102C and/or 102D and multiple SO lines 140 may be included in the magnetic device 100, 100C and/or 100D. The magnetic device 100, 100C and/or 100D may be used in a variety of electronic devices.

Referring to FIGS. 1A-1B, magnetic junction 102 includes free layer 110, nonmagnetic spacer layer 120 and reference layer 130. The magnetic junction 102 may also include optional polarization enhancement layer(s) (PEL(s)) having a high spin polarization. For example, a PEL might include Fe, CoFe and/or CoFeB. The PEL may be between reference layer 130 and nonmagnetic spacer layer 120 and/or between nonmagnetic spacer layer 120 and free layer 110. Contact, optional seed layer(s) and optional capping layer(s) may be present, but are not shown for simplicity. An optional pinning layer (not shown) may be used to fix the magnetization (not shown) of reference layer 130. The optional pinning layer may be an AFM layer or multilayer that pins the magnetization 132 of reference layer 130 by an exchange-bias interaction. However, in other embodiments, the optional pinning layer may be omitted or another structure may be used. Not shown is an optional insertion layer that may be between the SO line 140 and magnetic junction 102, 102C and/or 102D. Also not shown in FIGS. 1A-1D is the underlying substrate on which the components are provided. In some embodiments, the substrate is in the x-y plane. In such an embodiment, the z direction is perpendicular to the plane and vertical. In such embodiments, the magnetic junction 102 has the plane of its layers 110, 120 and 130 substantially parallel to the plane of the substrate.

Reference layer 130 is magnetic. In the embodiment shown, the reference layer magnetic moment 132 is substantially perpendicular-to-plane (e.g. in the z-direction). Thus, the reference layer perpendicular magnetic anisotropy energy exceeds the out-of-plane demagnetization energy. The reference layer magnetic moment 132 is shown as being oriented in the positive z-direction. In some embodiments, the magnetic moment 132 may be oriented in another direction including but not limited to the negative z-direction. Reference layer 130 may be a multilayer. For example, reference layer 130 may be a synthetic antiferromagnet (SAF) including multiple ferromagnetic layers interleaved with and sandwiching nonmagnetic layer(s) such as Ru, Ir, Rh or an alloy of these elements. Some such embodiments are shown in FIGS. 1C and 1D. In magnetic junctions 102C and 102D, reference layers 130C and 130D, respectively, have replaced reference layer 130. Reference layers 130C and 130D each include magnetic layers 134 and 138 separated by nonmagnetic layer 136, through which magnetic layers 134 and 138 are coupled. In the embodiment shown, magnetic moments 135 and 139 of magnetic layers 134 and 138, respectively, are antiferromagnetically coupled. In addition, magnetic device 100D has reversed the positions of magnetic junction 102D and DC layer 150. Thus, FIG. 1A could represent a top view of FIG. 1C and a bottom view of FIG. 1D. Other multilayers may be used in reference layer 130, 130C and/or 130D. Reference layer 130, 130C and/or 130D may include or consist of one or more of CoFe, CoFeB, FeB, and/or CoPt. As used herein CoFeB, FeB, CoB, CoPt and other materials listed denote alloys in which the stoichiometry is not indicated. For example, CoFeB may include $(CoFe)_{1-x}B_x$, where x is greater than or equal to zero and less than or equal to 0.5 as deposited. For example, x may be at least 0.2 and not more than 0.4. Other materials and/or structures are possible for the reference layer 130, 130C and/or 130D. The magnetic moment of reference layer(s) 130, 130C and/or 130D may take on various other configurations.

Nonmagnetic spacer layer 120 is between free layer 110 and reference layer 130, 130C and/or 130D 110. Nonmagnetic spacer layer 120 may be a tunneling barrier layer. For example, nonmagnetic spacer layer 120 may include or consist of MgO, aluminum oxide, $MgAl_2O_4$, and/or titanium oxide. Such an MgO nonmagnetic spacer layer 120 may be crystalline and have a 200 orientation for enhanced tunneling magnetoresistance (TMR). In other embodiments, nonmagnetic spacer layer 120 may be a different tunneling barrier layer, may be a conductive layer or may have another structure.

Free layer 110 is magnetic and may be a multilayer. For example, free layer 110 may include or consist of one or more of: Co, CoFe, Fe, CoFeB, CoFeBe, CoFeC, CoFeX, CoFeBX, CoFeBeX, CoFeCX, FeX, and CoX, where X is selected from Zr, Nb, Mo, Mg, Cr, Ta, Ti, W, V. Other and/or additional material(s) may be used. However, material(s) used for free layer 110 are selected in view of nonmagnetic spacer layer 120. For example, if nonmagnetic spacer layer 120 is MgO, the material(s) selected for free layer 110 may have a lattice and/or symmetry that sufficiently matches that of nonmagnetic spacer layer 120. The magnetic moment of free layer 110 may have various stable states that are discussed below. Free layer 110 is adjacent to (e.g. in proximity to) SO line 140. In the embodiment shown in FIGS. 1A-1D, free layer 110 adjoins, or shares an interface with at least a portion of a surface (e.g. the top or bottom surface) of SO line 140. In another embodiment, a thin layer may be inserted between free layer 110 and SO line 140. For example, such a layer may moderate/enhance SO torque, and/or serve as a seed layer. In the embodiment shown, the free layer magnetic moment 112 is stable in a direction substantially perpendicular-to-plane (e.g. in the positive or negative z-direction). Because multiple stable states are present, the free layer magnetic moment 112 is shown as a dual-headed arrow. The free layer thus has a high perpendicular magnetic anisotropy. The free layer perpendicular magnetic anisotropy energy exceeds the free layer out-of-plane demagnetization energy.

SO line 140 is a layer that has a strong spin-orbit interaction and is used in switching the magnetic moment of free layer 110. SO line 140 may include or consist of materials having a large SO angle with large spin-orbit coupling. For example, SO line 140 may include materials such as alloys of two or more of W, Pt, Tb, Bi, Hf, Zr, Ag, Au, and Si materials (e.g. WHf). In some embodiments, the alloys above may also have some oxidation at the interface. In some embodiments, SO line 140 may include a multilayer, such as Au/Si. In some embodiments, SO line 140 may include topological insulators (e.g. BiTe, BiSe, TlBiTe, TlBiSe, SbTeS, BiTeS, BiTeSe, GeSbTe, SnSbTe, GeBiTe, SnBiTe, BiSb, FeGeTe and/or BiSbSe). In some embodiments, SO line 140 may include some combination of the above material(s).

Although termed a "line", the term "line" need not imply a particular shape or orientation to the substrate. For example, the SO line 140 need not be a thin, rectangular or planar. Although the line 140 consists of the SO line 140 in FIGS. 1A-1D, in other embodiments, the line 140 may include other materials. For example, a higher conductivity material may replace or supplement the SO line 140 in regions distant from magnetic junction 102. In other embodiments, a higher resistivity/lower conductivity core might be used. A write current is driven along the length of the SO line 140 in the +x direction or the −x direction. In the embodiment shown in FIG. 1B, current is being driven through SO line 140 in the +x direction. This write current gives rise to an attendant SO interaction, which results in a spin-orbit torque used in writing to free layer 110.

Magnetic junctions 102, 102C and 102D are configured such that free layer 110 is switchable between stable magnetic states using a write current which is passed through the SO line 140 along the axis of the SO line 140 (e.g. along the x axis/±x direction in FIGS. 1A-1D). Thus, free layer 110 is programmable using SO torque. In some embodiments, free layer 110 is programmable in the absence of a write current driven through magnetic junction(s) 102, 102C and/or 102D. For example, free layer 110 may have an easy axis that is tilted from the z-axis. In such embodiments, spin transfer torque (STT), an external magnetic field, and/or a magnetic bias is not needed to write to the magnetic junction 102 in some embodiments. In alternate embodiments, however, a modest current driven through magnetic junction 102 (e.g. STT may be used in programming free layer 110) and/or an external magnetic field/magnetic bias may be used to assist in switching the free layer magnetic moment. More specifically, the STT, external magnetic field and/or magnetic bias may be used to select the final state (in the positive z-direction or the negative z-direction) of magnetic moment 112 of free layer 110.

Dipole-coupled (DC) layer 150 is also shown. DC layer 150 may be formed of the same materials as discussed with respect to free layer 110. In some embodiments, DC layer 150 may include or consist of $L1_0$ material(s) such as FePt, FePd and/or CoPt and/or $L1_2$ material(s) such as $Ni_3Fe$. In some embodiments, DC layer 150 may include or consist of hexagonal close packed material(s) such as CoPt alloys, a Co/Pt multilayer or single layer, Co/Pd layer(s), Co/Ni layer(s), and/or CoFe/Pt layer(s). Because DC layer 150 is not adjacent to (and does not adjoin/share an interface with) an MgO nonmagnetic spacer layer, in some embodiments a wider variety of materials may be used in DC layer 150 than for free layer 110. The perpendicular magnetic anisotropy energy of DC layer 150 is greater than the out-of-plane demagnetization energy. In the embodiment shown, DC layer magnetic moment 152 is substantially perpendicular to plane. In some embodiments, the magnetic anisotropy of DC layer 150 is less than the magnetic anisotropy of free layer 110. Thus, in such embodiments, DC layer 150 may start switching before free layer 110. At least one of free layer 110 and DC layer 150 has a high magnetic damping (e.g. a damping of greater than 0.02). In some embodiments, free layer 110 has low damping (less than 0.02 and less than 0.01 in some embodiments), while DC layer 150 has a high damping (i.e. greater than 0.02, and greater than 0.4 in some embodiments). In some embodiments, DC layer 150 has a thickness that is within five nanometers of the thickness of free layer 110. Free layer 110 may have a thickness of at least 0.5 nanometer and not more than five nanometers. In some embodiments, free layer 110 has a thickness of at least 0.8 nanometer and not more than 1.5 nanometers.

DC layer 150 is magnetically coupled to free layer 110. In the embodiment shown, DC layer 150 is dipole-coupled to free layer 110. Thus, DC layer magnetic moment 152 is coupled to free layer 110 having magnetic moment 112 such that DC layer magnetic moment 152 is aligned with free layer magnetic moment 112 when free layer magnetic moment 112 is in a stable state. However, as discussed below, during switching, DC layer magnetic moment 152 may be antiparallel to free layer magnetic moment 112. Thus, DC layer magnetic moment 152 provides partial or complete flux closure during switching. To provide the desired coupling, the distance between free layer 110 and DC layer 150 (e.g. the thickness of SO line 140 in the embodiment shown) may be not more than ten nanometers. In some embodiments, the distance between free layer 110 and DC layer 150 is not more than eight nanometers. In some embodiments, the distance between free layer 110 and DC layer 150 (e.g. the thickness of SO line 140 in the embodiment shown) may be at least three nanometers and not more than five nanometers.

Magnetic junctions 102, 102C and 102D may be read in a conventional manner. Thus, a read current insufficient to program the magnetic junction 102 using STT may be driven through the magnetic junction 102 in the direction perpendicular to at least some of the interfaces between the layers 110, 120 and 130. The resistance of magnetic junction 102 is based on the orientation between free layer magnetic moment 112 and reference layer magnetic moment 132. Thus, data may be read from magnetic junction 102 by determining the resistance of the magnetic junction 102.

In programming magnetic junctions 102, 102C and 102D, however, a write current is driven through the SO line 140 and substantially parallel to the top surface of SO line 140 adjacent to free layer 110. In the embodiment shown, this is along the x-axis. Based on the direction of the current, spins polarized in opposite directions may drift to opposing sides of SO line 140. This is shown in FIGS. 1B, 1C and 1D for a particular direction of the current. The spins near the surface of SO line 140 close to free layer 110 (i.e. the top surface for magnetic devices 100 and 100C and the bottom surface for magnetic device 100D) exert a torque to switch free layer magnetic moment 112. Similarly, spins near the surface of SO line 140 close to DC layer 150 (i.e. the bottom surface for magnetic devices 100 and 100C and the top surface for magnetic device 100D) tend to switch DC layer magnetic moment 152. Because DC layer 150 and free layer 110 are on opposite sides of the SO line 140 and because DC layer 150 and free layer 110 are magnetically (dipole) coupled, the polarized spins on both sides of SO line 140 are used in switching magnetic moments 112 and 152.

Figure 2A:
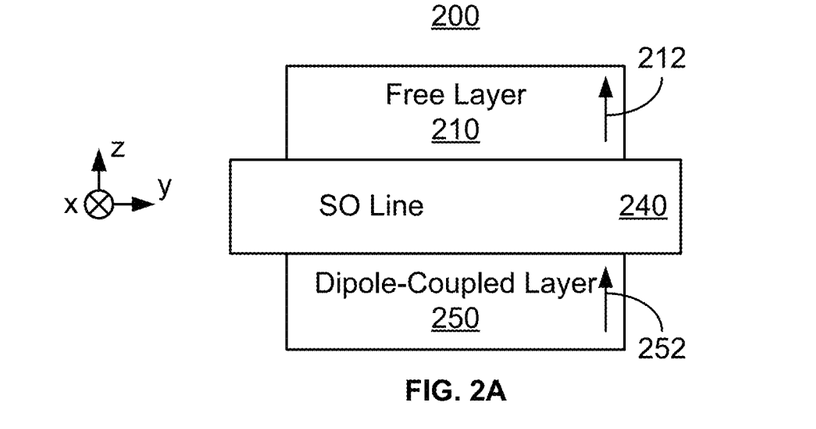
FIG. 2A-2C depicts an embodiment of a magnetic device including a magnetic junction written using spin orbit torque and including a dipole-coupled layer.
Figure 2B:
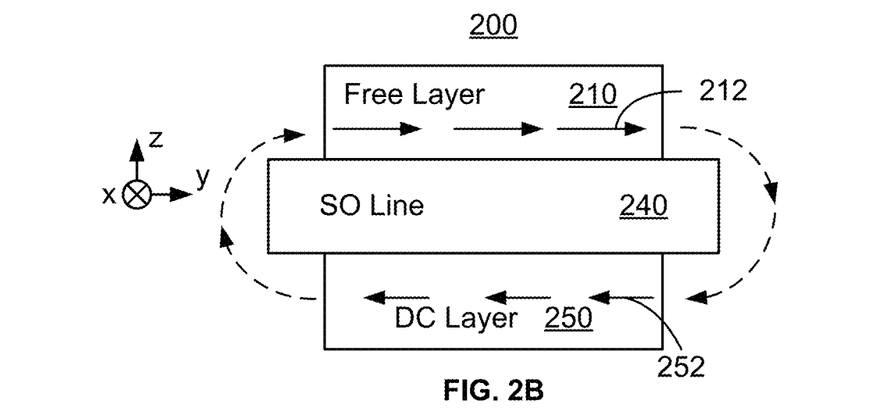
Figure 2C:
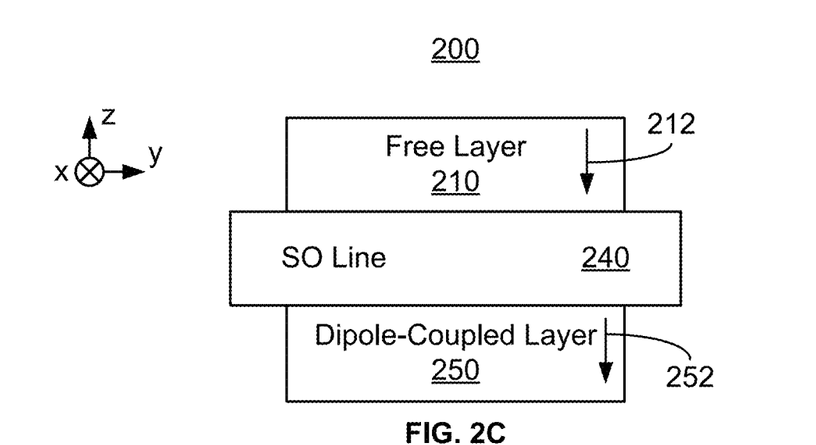

For example, FIGS. 2A-2C depict magnetic device 200 during switching between two states. Magnetic device 200 is analogous to magnetic devices 100, 100C and/or 100D. However, only free layer 210 of the magnetic junction is shown. Magnetic device 200 thus includes free layer 210, SO line 240, and DC layer 250 that are analogous to free layer 110, SO line 140 and DC layer 150, respectively. Consequently, the structure, function and materials used in free layer 210, SO line 240, and DC layer 250 are analogous to those used in free layer 110, SO line 140 and DC layer 150, respectively.

FIG. 2A depicts free layer 210 in a stable state. A current is driven in-plane in SO line 240. Consequently, spins polarized in opposite directions drift to the top and bottom surfaces of SO line 240. As a result, magnetic moments 212 and 252 begin to switch. This is shown in FIG. 2B. Thus, magnetic moments 212 and 252 are in-plane. Because the spins at the top and bottom surfaces of SO line 240 are in opposite directions, magnetic moments 212 and 252 for free layer 210 and DC layer 250, respectively, in FIG. 2B are antiferromagnetically aligned. Thus, DC layer 250 provides for at least partial flux closure during switching. For example, in some embodiments, DC layer 250 provides at least twenty percent flux closure for free layer 210 during switching. In some such embodiments, DC layer 250 provides at least forty percent flux closure for free layer 210 during switching. DC layer 250 may provide at least sixty percent flux closure for free layer 210 during switching. In some embodiments, DC layer 250 provides complete flux closure for free layer 210 during switching. The flux closure reduces the magnetic current density required to write to free layer 210. FIG. 2C depicts magnetic junction 200 after switching. Thus, magnetic moments 212 and 252 of free layer 210 and DC layer 250 are again ferromagnetically aligned.

Referring to FIGS. 1A-2C, magnetic devices 100, 100C, 100D and 200 may have improved performance. Because of the presence of DC layers 150 and 250 and the magnetic coupling to free layers 110 and 210, respectively, free layers 110 and 210 are more stable. Stated differently, free layers 110 and/or 210 on their own have an energy barrier to overcome in order to switch or destabilize the magnetic moment. In the quasi-uniform (macrospin) rotation model, the free layer energy barrier is given by $K_u V$, where $K_u$ is a magnetic anisotropy density of the free layer and V is the volume of the free layer. Because of the magnetic coupling between free layers 110 and/or 210 and DC layers 150 and/or 250, respectively, the effective energy barrier for the combination of free layer 110 and DC layer 150 or the combination of free layer 210 and DC layer 250 is greater than the free layer energy barrier. In some embodiments, the effective energy barrier is at least 1.5 multiplied by the free layer energy barrier. In some embodiments, the effective energy barrier is at least 1.8 multiplied by the free layer energy barrier. In some such embodiments, the effective energy barrier is at least 2 multiplied by the free layer energy barrier. This can also be thought of in terms of the magnetic thermal stability factor. In the quasi-uniform (macrospin) rotation model, the magnetic thermal stability factor of the free layers 110 and/or 210 is given by $\Delta = K_u V/k_B T$, where $K_u$ is a magnetic anisotropy density of the layer, $k_b$ is Boltzmann's constant, T is temperature in Kelvin and V is the volume of the free layer. For free layers 110 and/or 210 to be thermally stable, the magnetic thermal stability coefficient of free layers 110 and/or 210, $\Delta_{free\ layer}$, is generally desired to be at least sixty at operating temperatures, or standby temperatures such as at and around room temperature, or from at least −40° Celsius and not more than 150° Celsius. Due to DC layers 150 and/or 250, the magnetic thermal stability coefficient of the combination of free layers 110 and/or 210 and DC layers 150 and/or 250, $\Delta_{combination}$, is at least 1.5 multiplied by $\Delta_{free\ layer}$ ($\Delta_{combination} = 1.5 \Delta_{free\ layer}$). In some embodiments, $\Delta_{combination}$, is at least 1.8 multiplied by $\Delta_{free\ layer}$ ($\Delta_{combination} = 1.8 \Delta_{free\ layer}$). In some such embodiments, $\Delta_{combination}$, is at least 2 multiplied by $\Delta_{free\ layer}$ ($\Delta_{combination} = 2 \Delta_{free\ layer}$). Thus, for a given free layer, the energy barrier and magnetic thermal stability coefficient of the combination may be significantly higher than for the free layer alone. Stated differently, for a given energy barrier and magnetic thermal stability coefficient, a thinner free layer may be used, thus reducing writing current density. For example, a free layer having a thickness of 0.6 nanometer may be utilized in combination with a DC layer in lieu of a free layer alone having a thickness of 1.2 nanometers, while maintaining the same (or substantially the same) free layer energy barrier. Thus, stability may be improved.

Figure 3A:
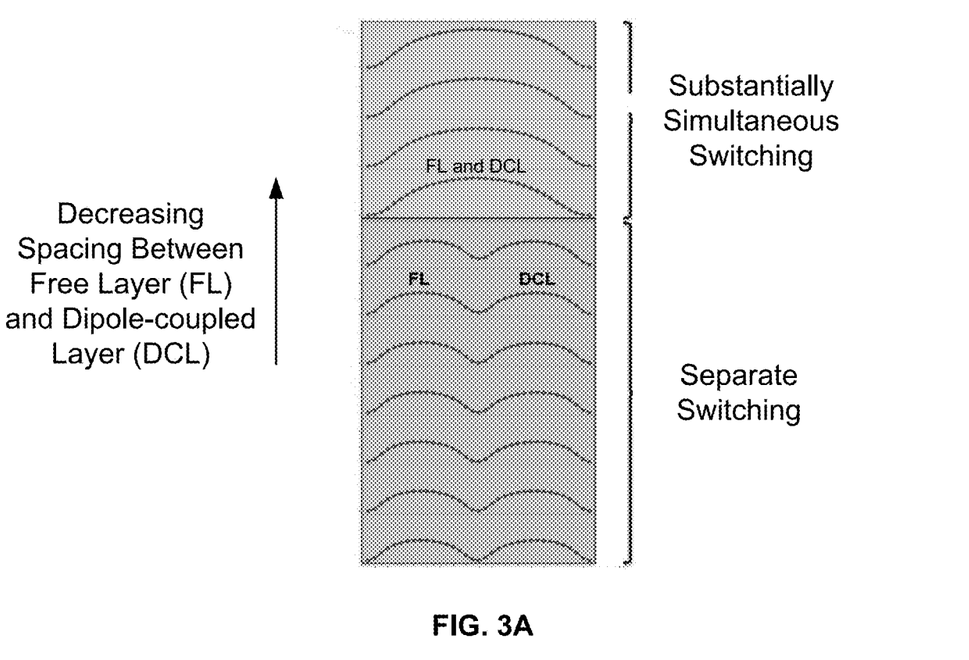
FIGS. 3A-3B depict the switching and energy barrier based on the distance between the free layer and the dipole-coupled layer.
Figure 3B:
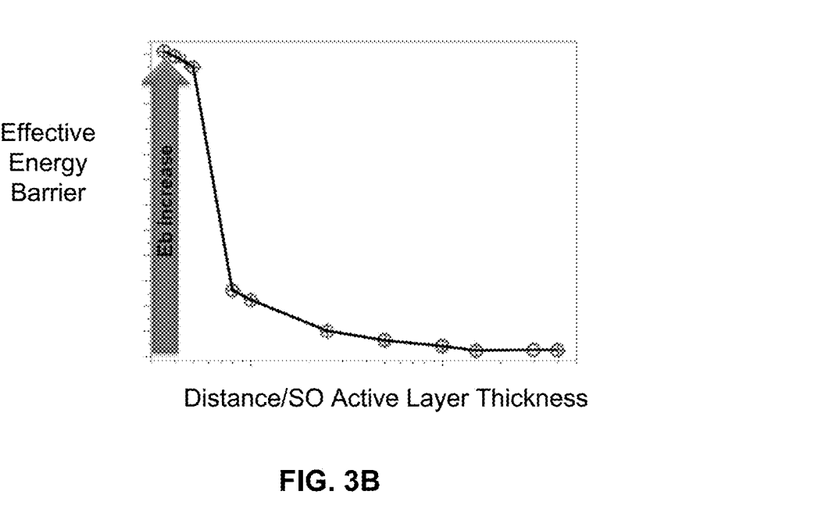

The improvement in stability may also be seen in FIGS. 3A and 3B. FIG. 3A depicts the energy during the switching of the combination of free layer 110 and/or 210 and DC layer 150 and/or 250 for various spacings between free layer 110 and/or 210 and DC layer 150 and/or 250. Local maxima indicate the energy barrier for switching of the layer. For larger spacings (lower on the graph in FIG. 3A) the free layer (FL) and DC layer (DCL) switch separately, indicating two maxima of equal height (since FL and DCL are identical for this case). For smaller spacings, for example less than eight nanometers (e.g. SO line 140 and/or 240 less than eight nanometers thick), free layer 110 and/or 210 and DC layer 150 and/or 250 switch together. This is indicated by the single peak and corresponds to a strong magnetic (e.g. dipole) coupling between free layer 110 and/or 210 and DC layer 150 and/or 250. Similarly, FIG. 3B indicates that the effective energy barrier significantly increases as the distance between free layer 110 and/or 210 and DC layer 150 and/or 250 decreases. This significant increase occurs where free layer 110 and/or 210 and DC layer 150 and/or 250 switch together and are magnetically coupled sufficiently strong to ensure simultaneous (or substantially simultaneous) switching.

In addition, the write current density required to program free layer 110 and/or 210 in combination with DC layer 150 and/or 250 may be reduced from the write current density required to program free layer 110 and/or 210 alone. For example, in some embodiments, the write current density may be reduced by at least five percent. In some embodiments, the write current density may be reduced by at least ten percent. In some embodiments, the write current density may be reduced by at least twenty percent. Thus, free layer 110 and/or 210 may be more thermally stable, but written using a lower current density.

Further, as discussed above, free layer 110 and/or 210 and/or DC layer 150 and/or 250 may have an enhanced damping to improve switching speed and to reduce or prevent any ringing effects after SOT current is removed. As a result, the magnetic moment(s) 112, 212, 150 and/or 250 may more rapidly settle to its final state. This may be achieved without adversely affecting writing because SO torque is used instead of STT. Thus, performance of free layer 110 and/or 210 and magnetic device(s) 100, 100C, 100D and/or 200 may be improved.

Figure 4A:
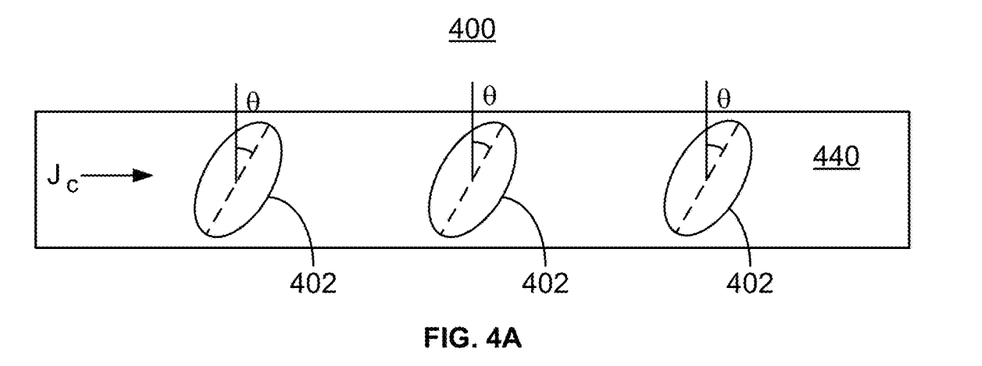
FIGS. 4A-4C depict embodiments of a magnetic device including a magnetic junction written using spin orbit torque and including a dipole-coupled layer.
Figure 4B:
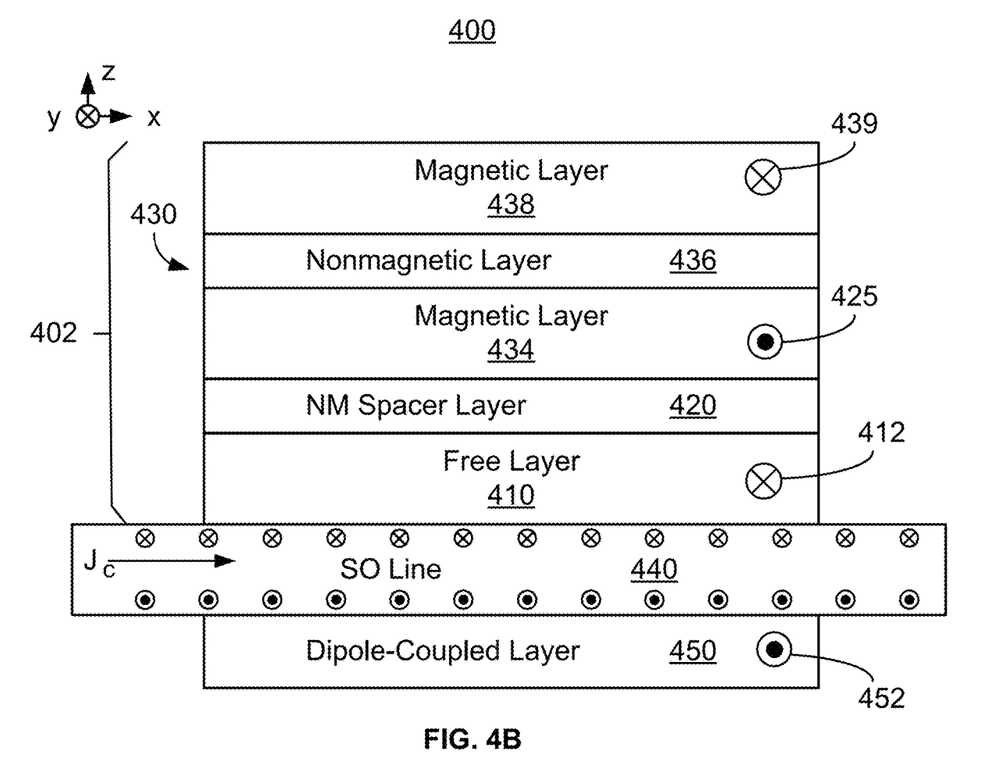
Figure 4C:
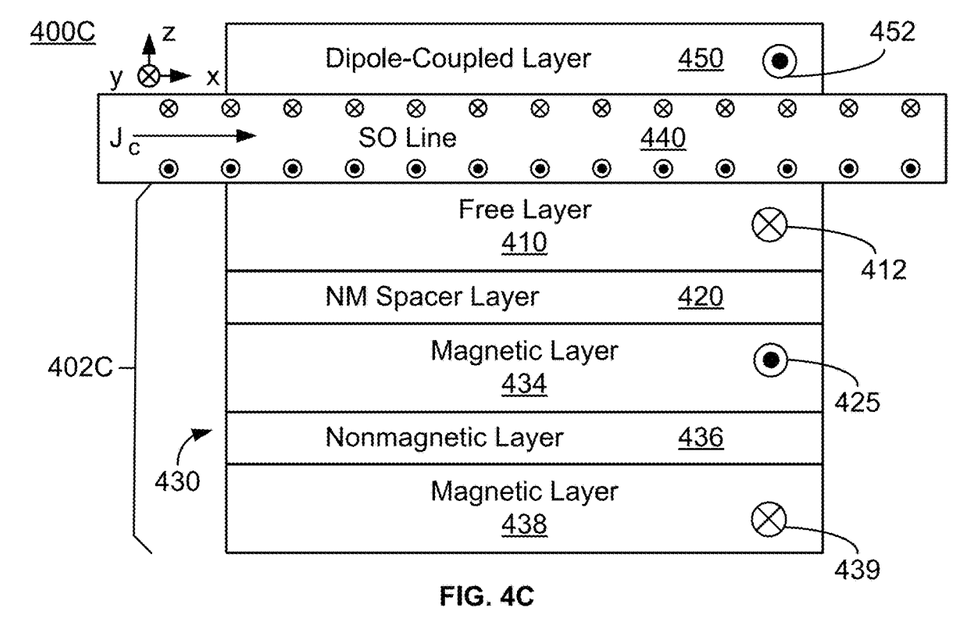

FIGS. 4A-4C depict embodiments of magnetic devices 400 and 400C including magnetic junctions 402 and 402C written using spin orbit torque and including a dipole-coupled layer. FIG. 4A depicts a top of an embodiment of a magnetic device including magnetic junctions 402, spin-orbit interaction (SO) line 440 and a dipole-coupled layer 450. FIGS. 4B and 4C depict side views of embodiments of magnetic devices 400 and 400C, respectively, including magnetic junctions 402 and 402C, respectively, written using spin-orbit torque and including dipole coupled layers 450. A bottom view for magnetic device 400C is analogous to that shown in FIG. 4A. For clarity, FIGS. 4A-4C are not to scale. In addition, portions of the magnetic devices 400 and 400C such as bit lines, row and column selectors are not shown. In some embodiments, selection devices (not shown) and other components may also be included. Although only one SO line 440 and some (or one) magnetic junctions are shown, multiple magnetic junctions 402 and/or 402C and multiple SO lines 440 may be included in the magnetic device 400 and/or 400C. The magnetic device 400 and/or 400C may be used in a variety of electronic devices.

Magnetic devices 400 and 400C are analogous to magnetic devices 100, 100C, 100D and/or 200. Magnetic devices 400 and 400C thus include magnetic junctions 402 and 402C that are analogous to magnetic junctions 100, 102C and/or 102D. Magnetic junctions 402 and 402C include free layer 410, nonmagnetic spacer layer 420 and reference layer 430 having ferromagnetic layers 434 and 438 separated by nonmagnetic layer 436 that are analogous to free layer 110, nonmagnetic spacer layer 120 and reference layer 130 having ferromagnetic layers 134 and 138 separated by nonmagnetic spacer layer 136. Magnetic devices 400 and 400C also include SO line 440 and DC layer 450 that are analogous to SO line 140 and DC layer 150, respectively. Consequently, the structure, function and materials used in magnetic junctions 402 and 402C, SO line 440, and DC layer 450 are analogous to those used in magnetic junctions 102, 102C and 102D, SO line 140 and DC layer 150, respectively. However, free layer 410 and DC layer 450 have the magnetic moments 412 and 452 with stable states in plane (e.g. in the positive y-direction and the negative y-direction). Although free layer 410 and DC layer 450 have their magnetic moments 412 and 452, respectively, stable in-plane, magnetic devices 400 and 400C operate in an analogous manner to magnetic devices 100, 100C, 100D, and 200. Magnetic layers 410 and 450 may have a small degree of partial perpendicular magnetic anisotropy PPMA, which is less than the total magnetic anisotropy needed to overcome the in-plane demagnetizing energy. In some embodiments, the PPMA may be as high as 50% of the demagnetizing energy. In some embodiments the PPMA may be as high as 70% of the demagnetizing energy.

Because of the presence of DC layer 450 and the magnetic coupling to free layer 410, free layer 410 is more stable. Stated differently, free layer 410 on its own has an energy barrier to overcome in order to switch or destabilize the magnetic moment. The effective energy barrier for the combination of free layer 410 and DC layer 450 is greater than the free layer energy barrier. In some embodiments, the effective energy barrier is at least 1.5 multiplied by the free layer energy barrier. In some embodiments, the effective energy barrier is at least 1.8 multiplied by the free layer energy barrier. In some such embodiments, the effective energy barrier is at least 2 multiplied by the free layer energy barrier. This can also be thought of in terms of the magnetic thermal stability factor. The magnetic thermal stability factor of the combination of free layer 410 and DC layer 450 similarly exceeds the thermal stability factor of free layer 410 alone. Thus, for a given free layer, the energy barrier and magnetic thermal stability factor of the combination may be significantly higher than those for the free layer alone. Stated differently, for a given energy barrier and magnetic thermal stability factor, a thinner free layer may be used. For example, a free layer having a thickness of 0.6 nanometer may be utilized in combination with a DC layer lieu of a free layer alone having a thickness of 1.2 nanometers, while maintaining the free layer energy barrier. Thus, thermal stability may be improved.

In addition, DC layer 450 provides at least partial flux closure for free layer 410 during switching in a manner analogous to DC layer 150 and free layer 110. Thus, the write current density required to program free layer 410 in combination with DC layer 450 may be reduced from the write current density required to program free layer 410 alone. In some embodiments, the write current density may be reduced by an analogous amount as discussed for free layers 110 and/or 210.

As indicated in FIG. 4A, magnetic junction 402 and/or 402C and free layer 410 may have an easy axis at a nonzero angle, θ, from the direction of the spin polarization for the current flowing in SO line 440. In some embodiments, θ is at least five degrees and not more than thirty degrees. This angle θ may be used to break the symmetry, allowing for free layer magnetic moment 412 to be switched to the desired state much faster than for the case when the angle is 0.

Magnetic devices 400 and 400C thus share the benefits of magnetic devices 100, 100C, 100D, and/or 200. In particular, magnetic devices 400 and 400C may have an increased energy barrier without incurring an increase in switching current. In some embodiments, the switching current may be reduced. In addition, magnetic junctions 402 and 402C may be written without driving an STT current, external field and/or magnetic bias applied to select the final state.

Figure 5A:
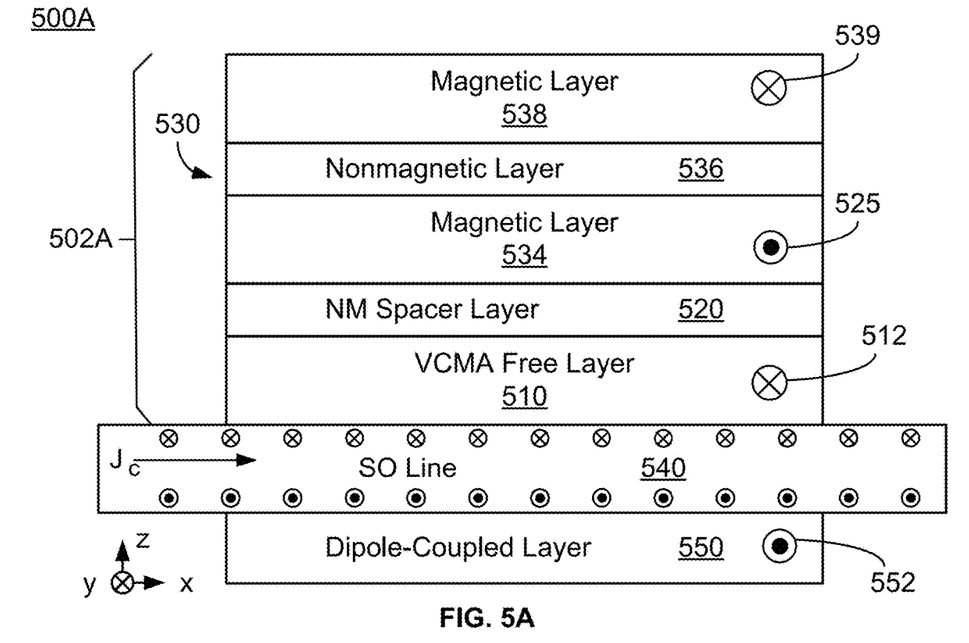
FIGS. 5A-5B depict embodiments of a magnetic device including a magnetic junction written using spin orbit torque and including a dipole-coupled layer.
Figure 5B:
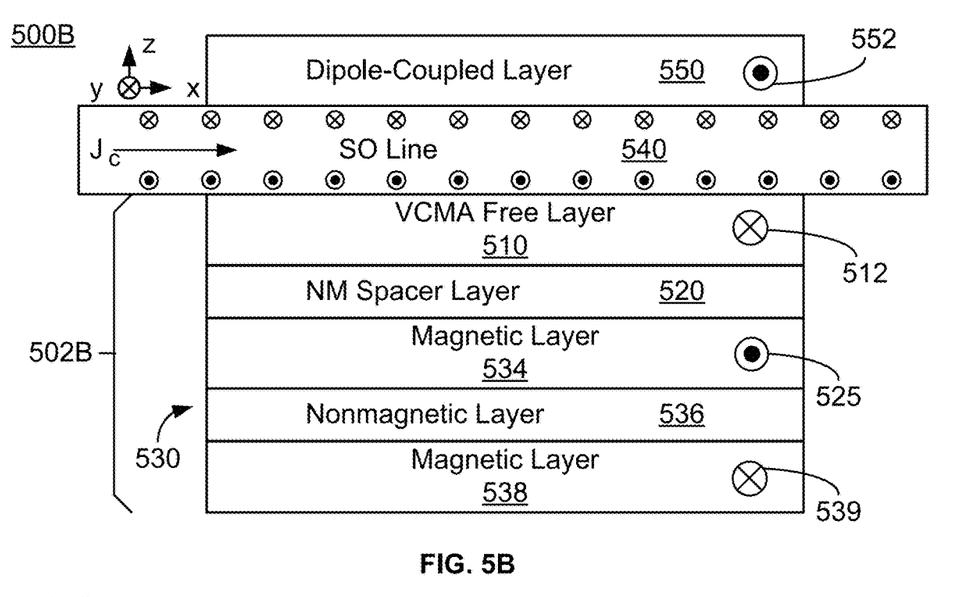

FIGS. 5A-5B depict embodiments of magnetic devices 500 and 500B including magnetic junction 502 and 502B written using spin orbit torque and including a dipole-coupled layer. FIGS. 5A and 5B depict side views of embodiments of magnetic devices 500 and 500B, respectively, including magnetic junctions 502 and 502B, respectively, written using spin-orbit torque and including dipole coupled layers 550. Also shown are SO lines 540. A top view of magnetic device 500 is analogous to that shown in FIG. 4A. A bottom view for magnetic device 500B is analogous to that shown in FIG. 4A. For clarity, FIGS. 5A-5B are not to scale. In addition, portions of the magnetic devices 500 and 500B such as bit lines, row and column selectors are not shown. In some embodiments, selection devices (not shown) and other components may also be included. Although only one SO line 540 and one magnetic junctions are shown, multiple magnetic junctions 502 and/or 502B and multiple SO lines 540 may be included in the magnetic device 500 and/or 500B. The magnetic device 500 and/or 500B may be used in a variety of electronic devices.

Magnetic devices 500 and 500B are analogous to magnetic devices 100, 100C, 100D, 200, 400 and/or 400C. Magnetic devices 500 and 500B thus include magnetic junctions 402 and 402B that are analogous to magnetic junctions 100, 102C, 102D, 402 and/or 402C. Magnetic junctions 502 and 502B include free layer 510, nonmagnetic spacer layer 520 and reference layer 530 having ferromagnetic layers 534 and 538 separated by nonmagnetic layer 536 that are analogous to free layer 110, nonmagnetic spacer layer 120 and reference layer 130 having ferromagnetic layers 134 and 138 separated by nonmagnetic spacer layer 136. Magnetic devices 500 and 500B also includes SO line 540 and DC layer 550 that are analogous to SO line 140 and DC layer 150, respectively. Consequently, the structure, function and materials used in magnetic junctions 502 and 502B, SO line 540, and DC layer 550 are analogous to those used in magnetic junctions 102, 102C and 102D, SO line 140 and DC layer 150, respectively. However, free layer 510 and DC layer 550 have the magnetic moments 512 and 552 with stable states in plane (e.g. in the positive y-direction and the negative y-direction).

Magnetic devices 500 and 500B operate in a manner analogous to magnetic devices 400 and 400C, respectively. Thus, magnetic devices 500 and 500B may have the enhancement in the effective energy barrier layer. In addition, DC layer 550 provides at least partial flux closure for free layer 510 during switching in a manner analogous to DC layer 150 and free layer 110. Magnetic devices 500 and 500B may thus program the free layer 510 at a lower write current density. Thus, performance of free layer 510 and magnetic device(s) 500 and/or 500B may be improved.

In addition, magnetic junction 502 and/or 502B and free layer 510 may have an easy axis at a nonzero angle analogous to the angle, θ, for magnetic devices 400 and/or 400C. This angle θ may be used to break the symmetry, allowing for free layer magnetic moment 512 to be switched to the desired state. Thus, free layer 510 may be programmed without requiring an externally applied field and/or a STT current driven through magnetic junction 502 and/or 502B to select the state of free layer 510. Thus, free layer 510 may be readily written to the desired state.

Free layer 510 in magnetic devices 500 and 500B also have voltage controlled magnetic anisotropy (VCMA). In some embodiments, the VCMA of free layer 510 may be configured to have a partial perpendicular magnetic anisotropy (PPMA) that increases in the presence of an applied voltage. For example, the PPMA of free layer 510 may be at least forty percent and not more than sixty percent of a demagnetizing energy when free layer 510 is quiescent (not being switched and not subject to an applied voltage). In some embodiments, the PPMA of free layer 510 is at least sixty percent and not more than eighty percent of the maximum value when free layer 510 is quiescent. As indicated in FIGS. 5A-5B, free layer magnetic moment 512 and DC layer magnetic moment 552 are stable in-plane.

Free layer magnetic moment 512 may go out-of-plane during switching. In order to assist with switching, a voltage is applied to free layer 510 during switching to increase the PPMA of free layer 510. In the examples above, the PPMA of free layer 510 is increased to be greater than sixty percent of the demagnetizing energy when free layer 510 is subjected to an applied voltage for switching. In some embodiments, the PPMA of free layer 510 is increased to be greater than eighty percent of the demagnetizing energy when free layer 510 is subjected to an applied voltage for switching. This applied voltage increases the PPMA of free layer 510, allowing free layer magnetic moment 512 to more readily switch. Thus, programming of magnetic junctions 502 and 502B may be facilitated.

Magnetic devices 500 and 500B thus share the benefits of magnetic devices 100, 100C, 100D, 200, 400 and/or 400C. In particular, magnetic devices 500 and 500B may have an increased energy barrier without incurring an increase in switching current. In some embodiments, the switching current may be reduced. In addition, magnetic junctions 502 and 502C may be written without driving an STT current, external field and/or magnetic bias applied to select the final state. Moreover, because free layer 510 has a VCMA that increases the PPMA of free layer 510 when a voltage is applied, free layer 510 may be more readily switched. Thus, performance of magnetic devices 500 and/or 500B may be improved. In addition to assisting in switching, the PPMA can be used as a selection mechanism for a device, which has several magnetic tunneling junction cells along the same SOT-line with applied current. Thus, only devices which have additional positive or negative voltage across the magnetic tunneling junction will be switched. The direction of the switching will be determined by the voltage polarity across a given magnetic tunneling junction.

Figure 6:
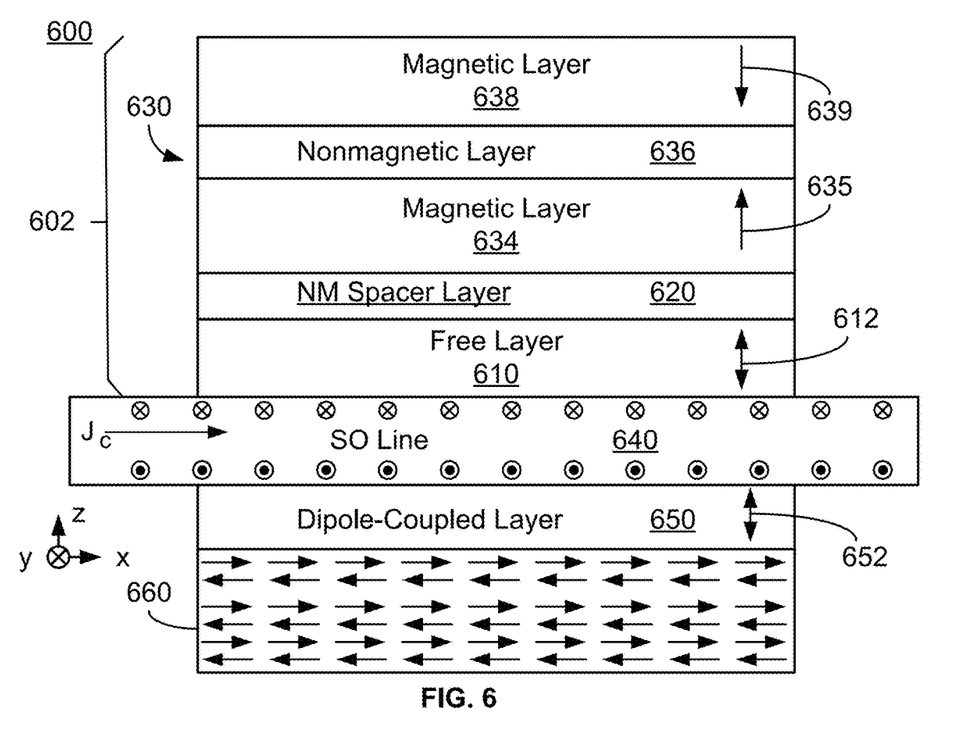
FIG. 6 depicts an embodiment of a magnetic device including a magnetic junction written using spin orbit torque and including a dipole-coupled layer.

FIG. 6 depicts a side view of an embodiment of magnetic device 600 including magnetic junction 602 written using spin orbit torque and including a dipole-coupled layer 650. Also shown is SO line 640. A top view of magnetic device 600 is analogous to that shown in FIG. 1A. For clarity, FIG. 6 is not to scale. In addition, portions of magnetic device 600 such as bit lines, row and column selectors are not shown. In some embodiments, selection devices (not shown) and other components may also be included. Although only one SO line 640 and one magnetic junction are shown, multiple magnetic junctions 602 and multiple SO lines 640 may be included in magnetic device 600. The magnetic device 600 may be used in a variety of electronic devices.

Magnetic device 600 is analogous to magnetic devices 100, 100C, 100D, 200, 400, 400C, 500 and/or 500B. Magnetic device 600 thus includes magnetic junction 502 that is analogous to magnetic junctions 100, 102C, 102D, 402, 402C, 502 and/or 502B. Magnetic junction 602 includes free layer 610, nonmagnetic spacer layer 620 and reference layer 630 having ferromagnetic layers 634 and 638 separated by nonmagnetic layer 636 that are analogous to free layer 110, nonmagnetic spacer layer 120 and reference layer 130 having ferromagnetic layers 134 and 138 separated by nonmagnetic spacer layer 136. Magnetic device 600 also includes SO line 640 and DC layer 650 that are analogous to SO line 140 and DC layer 150, respectively. Consequently, the structure, function and materials used in magnetic junction 602, SO line 640, and DC layer 650 are analogous to those used in magnetic junctions 102, 102C and 102D, SO line 140 and DC layer 150, respectively. Further, free layer 610 and DC layer 650 each has a perpendicular magnetic anisotropy energy that exceeds the out-of-plane demagnetization energy. In the embodiment shown, free layer 610 and DC layer 650 have the magnetic moments 612 and 652 with stable states perpendicular-to-plane.

Magnetic device 600 operates in a manner analogous to magnetic devices 100, 100C, 100D and 200. Thus, magnetic device 600 may have the enhancement in the effective energy barrier layer. In addition, DC layer 650 provides at least partial flux closure for free layer 610 during switching in a manner analogous to DC layer 150 and free layer 110. Magnetic device 600 may thus program the free layer 610 at a lower write current density. Further, as discussed above, free layer 610 and/or DC layer 650 may have an enhanced damping. As a result, the magnetic moment(s) 612 and/or 652 may more rapidly settle to its final state. This may be achieved without adversely affecting writing because SO torque is used instead of STT. Thus, performance of free layer 610 and magnetic device 600 may be improved.

In addition, magnetic device 600 includes symmetry-breaking layer 660. In the embodiment shown, symmetry-breaking layer 660 is an antiferromagnetic (AFM) layer. In other embodiments, symmetry-breaking layer 660 may have another configuration. In some embodiments, AFM layer 660 includes one or more of intermetallic compounds, oxides, nitrides, and/or transition metal dichalcogenides. AFM layer 660 may have a high Neel temperature. In addition, AFM layer 660 may be an insulator or semiconductor to reduce current shunting by AFM layer 660. For example, AFM layer 660 may include one or more of $IrMn_3$, $PtMn$, $MnPd2$, $FeMn$, $CuMnAs$, $FeRh$, $NiO$, $Ni_xCo_{1-x}O$ $Cr_2O_3$, $LaFeO_3$, $a-Fe_2O_3$, $BiFeO_3$, $SmFeO_3$, $MnN$, and/or Fe-doped $NbS_2$. AFM layer 660 is magnetically coupled with DC layer 650. As a result, AFM layer 660 breaks the symmetry, allowing for free layer magnetic moment 612 to be switched to the desired state. Thus, free layer 610 may be programmed without requiring an externally applied field and/or a STT current driven through magnetic junction 602 to select the state of free layer 610. Thus, free layer 610 may be readily written to the desired state. Further, although DC layer 650 and AFM layer 660 are shown as below SO line 640 and magnetic junction 602 is above SO line 640, their positions could be reversed in a manner analogous to magnetic junctions 100D, 400C, and 500B. In some embodiments, to set the magnetization of the AFM layer 660 in a preferred orientation, a magnetic field annealing is performed (temperature is increased above blocking temperature while a strong magnetic field is applied). The magnetic field during the field annealing step may at least 2 T and up to 5 T and the annealing temperature can be at least 250° Celsius and not more than 450° Celsius in some cases.

Magnetic device 600 thus shares the benefits of magnetic devices 100, 100C, 100D, 200, 400, 400C, 500 and/or 500B. In particular, magnetic device 600 may have an increased energy barrier without incurring an increase in switching current. In some embodiments, the switching current may be reduced. Enhanced damping allows for more rapid switching. In addition, magnetic junction 602 may be written without driving an STT current, external field and/or magnetic bias (other than from symmetry-breaking layer 660) applied to select the final state. Thus, performance of magnetic device 600 may be improved.

Figure 7:
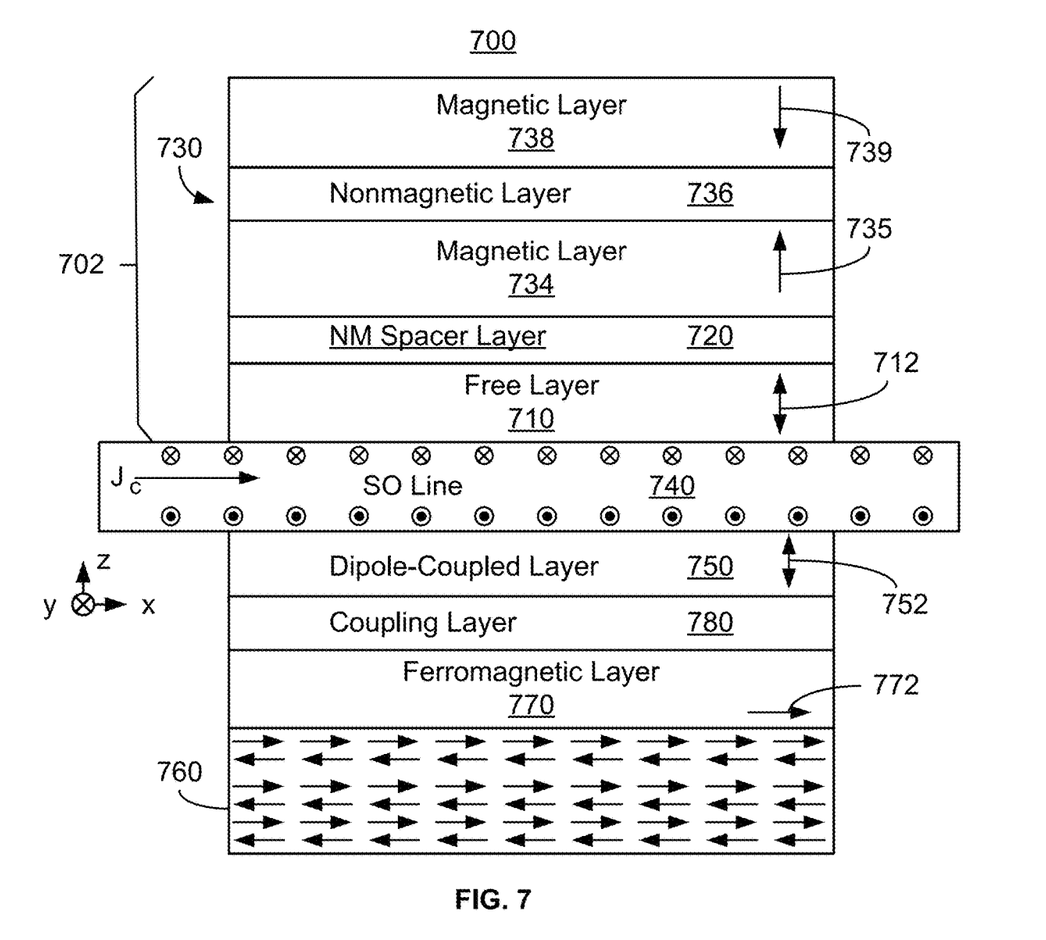
FIG. 7 depicts an embodiment of a magnetic device including a magnetic junction written using spin orbit torque and including a dipole-coupled layer.

FIG. 7 depicts a side view of an embodiment of magnetic device 700 including magnetic junction 702 written using spin orbit torque and including a dipole-coupled layer 750. Also shown is SO line 740. A top view of magnetic device 700 is analogous to that shown in FIG. 1A. For clarity, FIG. 7 is not to scale. In addition, portions of magnetic device 700 such as bit lines, row and column selectors are not shown. In some embodiments, selection devices (not shown) and other components may also be included. Although only one SO line 740 and one magnetic junction are shown, multiple magnetic junctions 702 and multiple SO lines 740 may be included in magnetic device 700. The magnetic device 700 may be used in a variety of electronic devices.

Magnetic device 700 is analogous to magnetic devices 100, 100C, 100D, 200, 400, 400C, 500, 500B and/or 600. Magnetic device 700 thus includes magnetic junction 602 that is analogous to magnetic junctions 100, 102C, 102D, 402, 402C, 502, 502B and/or 602. Magnetic junction 702 includes free layer 710, nonmagnetic spacer layer 720 and reference layer 730 having ferromagnetic layers 734 and 738 separated by nonmagnetic layer 736 that are analogous to free layer 110, nonmagnetic spacer layer 120 and reference layer 130 having ferromagnetic layers 134 and 138 separated by nonmagnetic spacer layer 136. Magnetic device 700 also includes SO line 740 and DC layer 750 that are analogous to SO line 140 and DC layer 150, respectively. Consequently, the structure, function and materials used in magnetic junction 702, SO line 740, and DC layer 750 are analogous to those used in magnetic junctions 102, 102C and 102D, SO line 140 and DC layer 150, respectively. Further, free layer 710 and DC layer 750 each has a perpendicular magnetic anisotropy energy that exceeds the out-of-plane demagnetization energy. In the embodiment shown, free layer 710 and DC layer 750 have the magnetic moments 712 and 752 with stable states perpendicular-to-plane. Although DC layer 750 is shown as below SO line 740 and magnetic junction 702 is above SO line 740, their positions could be reversed in a manner analogous to magnetic junctions 100D, 400C, and 500B.

Magnetic device 700 operates in a manner analogous to magnetic devices 100, 100C, 100D and 200. Thus, magnetic device 700 may have the enhancement in the effective energy barrier layer. In addition, DC layer 750 provides at least partial flux closure for free layer 610 during switching in a manner analogous to DC layer 150 and free layer 110. Magnetic device 700 may thus program the free layer 710 at a lower write current density. Further, as discussed above, free layer 710 and/or DC layer 750 may have an enhanced damping. As a result, the magnetic moment(s) 712 and/or 752 may more rapidly settle to its final state. This may be achieved without adversely affecting writing because SO torque is used instead of STT. Thus, performance of free layer 710 and magnetic device 700 may be improved.

In addition, magnetic device 700 includes symmetry-breaking layer 760 analogous to symmetry-breaking layer 660. Thus, symmetry-breaking layer 760 is AFM layer 760 and may include the materials described with respect to AFM layer 660. Magnetic device 700 also includes ferromagnetic layer 770 and coupling layer 780. In some embodiments, ferromagnetic layer 770 may be replaced by a ferrimagnetic layer. AFM layer 760 is magnetically coupled with ferromagnetic layer 770. Thus, ferromagnetic layer magnetic moment 772 is shown as having a particular, stable alignment. Ferromagnetic layer 770 is coupled to DC layer 750 through coupling layer 780. Coupling layer 780 is nonmagnetic and configured to moderate the interaction between ferromagnetic layer 770 and DC layer 760. For example, the thickness of coupling layer 780 may be selected to provide the desired coupling with DC layer 750. The combination of, AFM layer 760, ferromagnetic layer 770 and coupling layer 780 breaks the symmetry, allowing for free layer magnetic moment 712 to be switched to the desired state. Thus, free layer 710 may be programmed without requiring an externally applied field and/or a STT current driven through magnetic junction 702 to select the state of free layer 710. Thus, free layer 710 may be readily written to the desired state. Although DC layer 750, AFM layer 760, ferromagnetic layer 770 and coupling layer 780 are shown below SO line 740 and magnetic junction 702 is above SO line 740, their positions could be reversed in a manner analogous to magnetic junctions 100D, 400C, and 500B.

Magnetic device 700 thus shares the benefits of magnetic devices 100, 100C, 100D, 200, 400, 400C, 500, 500B and/or 600. In particular, magnetic device 700 may have an increased energy barrier without incurring an increase in switching current. In some embodiments, the switching current may be reduced. Enhanced damping allows for more rapid switching. In addition, magnetic junction 602 may be written without driving an STT current, external field and/or magnetic bias (other than from symmetry-breaking layer 760) applied to select the final state. Thus, performance of magnetic device 700 may be improved.

Figure 8:
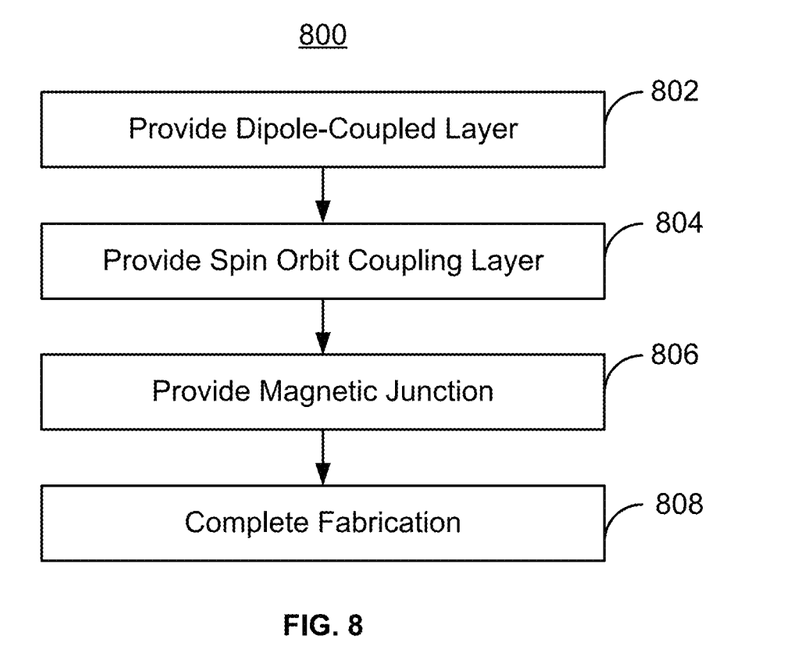
FIG. 8 is a flow chart depicting an embodiment of a method for fabricating magnetic device including a magnetic junction written using spin orbit torque and a dipole-coupled layer.

FIG. 8 is a flow chart depicting an embodiment of method 800 for fabricating magnetic device including a magnetic junction written using spin orbit torque and including a dipole-coupled layer. For simplicity, some steps may be omitted, performed in another order, include substeps and/or combined. Although described in the context of single components, multiple components may be fabricated. For example, multiple magnetic junctions, DC layers and/or SO lines may be fabricated. Further, the method 800 may start after other steps in forming a magnetic memory have been performed. For simplicity, the method 800 is described in the context of the magnetic device 100. However, other magnetic devices, including but not limited to the magnetic devices 100C, 100D, 200, 400A, 400C, 500, 500B, 600 and/or 700 may be formed.

A DC layer is provided, via step 802. In some embodiments, 802 includes depositing and patterning the DC layer. The material(s) for the DC layer provided at 802 have a high (or enhanced) damping. An SO line is provided, at 804. In some embodiments, 804 includes depositing the material(s) for the SO line and patterning the SO line. In some embodiments, the SO line shares an interface with the DC layer. In other embodiments, layer(s) may be inserted between the DC layer and the SO line. A magnetic junction including a free layer adjacent to the SO line, at 806. In some embodiments, the free layer adjoins (shares an interface with) the SO line. In other embodiments, layer(s) may be inserted between the free layer and the SO line. Also at 806, a nonmagnetic spacer layer and a reference layer are also provided. In some embodiments, other components such as polarization enhancement layers may be provided in the magnetic junction. Fabrication of the device may be completed, at 808.

Using the method 800, the magnetic devices 100, 100C, 100D, 200, 400, 400C, 500, 500B, 600, 700 and/or analogous magnetic devices may be fabricated. As a result, the benefits of the magnetic devices 100, 100C, 100D, 200, 400, 400C, 500, 500B, 600, and/or 700 may be achieved.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A magnetic device, comprising:
   at least one magnetic junction including a free layer;
   a spin-orbit interaction (SO) line adjacent to the free layer, the SO line carrying a current in-plane and exerting an SO torque on the free layer due to the current passing through the SO line, the free layer being switchable between a plurality of stable magnetic states using the SO torque; and
   a dipole-coupled layer, the SO line residing between the free layer and the dipole-coupled layer, the dipole-coupled layer being magnetically coupled to the free layer, at least one of the free layer and the dipole-coupled layer having a damping of greater than 0.02.

2. The magnetic device of claim 1, wherein the magnetic junction includes a reference layer and a nonmagnetic spacer layer between the reference layer and the free layer, the reference layer includes a first magnetic layer, a second magnetic layer and a nonmagnetic layer between the first magnetic layer and the second magnetic layer, the first magnetic layer and the second magnetic layer being antiferromagnetically coupled.

3. The magnetic device of claim 1, wherein the free layer has a free layer perpendicular magnetic anisotropy energy greater than a free layer out-of-plane demagnetization energy and wherein the dipole-coupled layer has a dipole-coupled layer perpendicular magnetic anisotropy energy greater than a dipole-coupled layer out-of-plane demagnetization energy.

4. The magnetic device of claim 1, wherein the free layer is separated from the dipole-coupled layer by a distance of not more than eight nanometers.

5. The magnetic device of claim 4, wherein the distance is at least three nanometers and not more than five nanometers.

6. The magnetic device of claim 1, wherein the plurality of stable states of the free layer are in-plane.

7. The magnetic device of claim 6, wherein the free layer has a partial perpendicular magnetic anisotropy of at least fifty percent of a free layer demagnetizing energy.

8. The magnetic device of claim 6, wherein the free layer has an in-plane anisotropy at an angle from a direction of the spin polarization of the current, the angle being at least five degrees and not more than thirty degrees.

9. The magnetic device of claim 8, wherein the free layer has a voltage sensitive perpendicular magnetic anisotropy.

10. The magnetic device of claim 1, wherein the dipole-coupled layer has a dipole-coupled magnetic anisotropy, the free layer has a free layer magnetic anisotropy, the dipole-coupled magnetic anisotropy being less than the free layer magnetic anisotropy.

11. The magnetic device of 10, wherein the free layer has a free layer thickness of at least 0.5 nanometers and not more than five nanometers, the dipole-coupled layer having a dipole-coupled thickness within 1.5 nanometer of the free layer thickness.

12. The magnetic device of claim 1, further comprising:
an antiferromagnetic layer adjacent to the dipole-coupled layer.

13. The magnetic device of claim 12, further comprising a ferromagnetic layer between the antiferromagnetic layer and the dipole-coupled layer, the ferromagnetic layer sharing an interface with the antiferromagnetic layer; and
a coupling layer between the ferromagnetic layer and the dipole-coupled layer.

14. The magnetic device of claim 1, wherein the dipole-coupled layer is configured to provide at least partial flux closure for the free layer during switching between the plurality of stable magnetic states.

15. The magnetic device of claim 14, wherein the effective energy barrier is at least 1.8 multiplied by the free layer energy barrier.

16. A magnetic device, comprising:
a magnetic junction including a free layer, the free layer having a free layer energy barrier due to a free layer-only configuration;
a spin-orbit interaction (SO) line adjacent to the free layer, the SO line carrying a current in-plane and exerting an SO torque on the free layer due to the current passing through the SO line, the free layer being switchable between a plurality of stable magnetic states using the SO torque; and
a dipole-coupled layer, the SO line residing between the free layer and the dipole-coupled layer, at least one of the free layer and the dipole-coupled layer having a damping of greater than 0.02, the dipole-coupled layer being magnetically coupled to the free layer such that a combination of the dipole-coupled layer and the free layer has an effective energy barrier at least 1.5 multiplied by the free layer energy barrier.

17. The magnetic device of claim 16, wherein the free layer is separated from the dipole-coupled layer by a distance of not more than eight nanometers.

18. The magnetic device of claim 16, wherein the distance is at least three nanometers and not more than five nanometers.

19. A method for providing a magnetic device, comprising:
providing a magnetic junction including a free layer;
providing a spin-orbit interaction (SO) line adjacent to the free layer, the SO line carrying a current in-plane and exerting an SO torque on the free layer due to the current passing through the SO line, the free layer being switchable between a plurality of stable magnetic states using the SO torque; and
providing a dipole-coupled layer, the SO line residing between the free layer and the dipole-coupled layer, the dipole-coupled layer being magnetically coupled to the free layer, at least one of the free layer and the dipole-coupled layer having a damping of greater than 0.02.

20. The method of claim 19, wherein the providing the SO line further includes:
providing an SO line having a thickness of not more than eight nanometers.

* * * * *